(12) United States Patent
Butler

(10) Patent No.: US 8,044,373 B2
(45) Date of Patent: Oct. 25, 2011

(54) LITHOGRAPHIC APPARATUS AND DEVICE MANUFACTURING METHOD

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 257 days.

(21) Appl. No.: 11/812,090

(22) Filed: Jun. 14, 2007

(65) Prior Publication Data

US 2008/0308749 A1   Dec. 18, 2008

(51) Int. Cl.
G03B 27/54 (2006.01)

(52) U.S. Cl. .......... 250/492.2; 250/492.1; 250/442.11; 359/642; 359/811; 359/819

(58) Field of Classification Search .......... 250/492.2, 250/442.11, 492.1, 491.1, 492.11; 359/642, 359/811, 819; 355/53, 55, 75, 72; 378/34, 378/204; 318/560
See application file for complete search history.

(56) References Cited

U.S. PATENT DOCUMENTS

| | | | | |
|---|---|---|---|---|
| 5,816,373 A * | 10/1998 | Osterberg et al. | ............. | 188/380 |
| 5,883,704 A * | 3/1999 | Nishi et al. | .................. | 355/67 |
| 6,275,344 B1 * | 8/2001 | Holderer | ..................... | 359/822 |
| 6,359,688 B2 * | 3/2002 | Akimoto et al. | ............. | 356/401 |
| 6,420,716 B1 * | 7/2002 | Cox et al. | .................. | 250/492.2 |
| 6,473,159 B1 * | 10/2002 | Wakui et al. | .................... | 355/53 |
| 6,510,121 B2 * | 1/2003 | Ijima et al. | ..................... | 720/684 |
| 6,750,947 B1 * | 6/2004 | Tomita et al. | ................... | 355/52 |
| 6,791,664 B2 * | 9/2004 | Auer et al. | ...................... | 355/53 |
| 6,879,375 B1 * | 4/2005 | Kayama | .......................... | 355/53 |
| 6,897,599 B2 * | 5/2005 | Sorg et al. | ..................... | 310/326 |
| 6,912,041 B2 * | 6/2005 | Butler et al. | ..................... | 355/53 |
| 7,292,317 B2 * | 11/2007 | Cox et al. | ........................ | 355/72 |
| 7,474,384 B2 * | 1/2009 | Bleeker et al. | ................. | 355/67 |
| 2001/0026408 A1 * | 10/2001 | Tanaka | ......................... | 359/826 |
| 2002/0113191 A1 * | 8/2002 | Rolt et al. | ..................... | 248/550 |
| 2002/0149754 A1 * | 10/2002 | Auer et al. | ..................... | 355/53 |
| 2003/0169517 A1 * | 9/2003 | Weber | ........................... | 359/819 |
| 2003/0197845 A1 * | 10/2003 | Morisada | ........................ | 355/53 |
| 2003/0197914 A1 * | 10/2003 | Cox et al. | ....................... | 359/223 |
| 2004/0178354 A1 * | 9/2004 | Visscher | ................. | 250/442.11 |
| 2005/0190351 A1 * | 9/2005 | Cox et al. | ........................ | 355/53 |
| 2006/0110665 A1 * | 5/2006 | Bleeker et al. | ................. | 430/22 |
| 2006/0232866 A1 * | 10/2006 | Sai et al. | ....................... | 359/849 |
| 2007/0097340 A1 * | 5/2007 | Yuan et al. | ...................... | 355/53 |
| 2007/0202628 A1 * | 8/2007 | Wuertz | .......................... | 438/53 |
| 2007/0206167 A1 * | 9/2007 | Mizutani | ......................... | 355/52 |
| 2008/0068568 A1 * | 3/2008 | Ebihara et al. | ................. | 355/30 |
| 2008/0098813 A1 * | 5/2008 | Sekiguchi | ........................ | 73/490 |
| 2008/0259469 A1 * | 10/2008 | Arai | .............................. | 359/819 |
| 2010/0225121 A1 * | 9/2010 | Bradley et al. | ................ | 290/1 R |

* cited by examiner

Primary Examiner — Robert Kim
Assistant Examiner — Michael J Logie
(74) Attorney, Agent, or Firm — Pillsbury Winthrop Shaw Pittman LLP

(57) ABSTRACT

A lithographic apparatus is disclosed having a projection system housing supporting internally one or more lens elements, and a movement damper connected to the projection system housing, the movement damper configured to damp movement of the projection system housing at an eigenfrequency of at least one of the one or more lens elements and/or of the projection system housing.

19 Claims, 3 Drawing Sheets

LITHOGRAPHIC APPARATUS AND DEVICE MANUFACTURING METHOD

FIELD

The present invention relates to a lithographic apparatus and a method for improving servo performance

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

In an embodiment of a lithographic apparatus, the projection system comprises a projection system housing supporting internally one or more lens elements. The lens elements may be mounted in the projection system housing with very low damping, the result of a stable lens mounting construction using a limited set of allowed materials in the projection system. However, due to the low damping, the lens elements may easily be excited to vibrate at an eigenfrequency. Such vibrations of one or more lens elements may have a negative influence on the imaging accuracy of the lithographic apparatus.

Additionally or alternatively, due to the vibrations of the lens elements, the servo control of the substrate support and/or patterning device support may be negatively influenced. In a lithographic apparatus, a servo control system is often used to position the substrate/patterning device support with respect to the projection system. In an embodiment, the position of the projection system is introduced into the servo control loop so that movement/vibration of the projection system is taken into account when positioning the respective support. An example of such a servo controller is disclosed in U.S. Pat. No. 6,420,716, the entire contents of which is herein incorporated by reference. In that system, a sensor is provided to measure movements of the projection system housing. A position dependent signal measured with this sensor is introduced into the servo control loop.

Since such a servo control system is designed to actuate the respective support to follow movements of the projection system housing, vibration at an eigenfrequency of one or more lens elements and resulting movement of the projection system housing may substantially increase the settling time of the respective support, thus decreasing the performance of the servo control system. As a result, the overall throughput of the lithographic apparatus may decrease.

It is desirable, for example, to provide a lithographic apparatus in which the imaging accuracy and/or the throughput is improved.

According to an aspect of the invention, there is provided a lithographic apparatus comprising:

an illumination system configured to condition a radiation beam;

a patterning device support configured to hold a patterning device, the patterning device capable of imparting the radiation beam with a pattern in its cross-section to form a patterned radiation beam;

a substrate support constructed to hold a substrate;

a projection system configured to project the patterned radiation beam onto a target portion of the substrate, the projection system comprising a projection system housing supporting internally one or more lens elements; and a movement damper connected to the projection system housing, the movement damper configured to damp movement of the projection system housing at an eigenfrequency of at least one of the one or more lens elements and/or of the projection system housing.

According to an aspect of the invention, there is provided a method for improving servo performance of a movable stage in a lithographic apparatus, the lithographic apparatus comprising a projection system housing including one or more lens elements and a controller of the movable stage using a position signal of the projection system housing, the method comprising damping movement of the projection system housing at an eigenfrequency of at least one of the one or more lens elements and/or of the projection system housing using a movement damper connected to the projection system housing.

According to an aspect of the invention, there is provided a device manufacturing method, comprising:

projecting a patterned beam of radiation onto a target portion of a substrate using one or more lens elements supported by a projection system housing; and damping movement of the projection system housing at an eigenfrequency of at least one of the one or more lens elements and/or of the projection system housing.

According to an aspect of the invention, there is provided a lithographic apparatus comprising:

an illumination system configured to condition a radiation beam;

a patterning device support configured to hold a patterning device, the patterning device capable of imparting the radiation beam with a pattern in its cross-section to form a patterned radiation beam;

a substrate support constructed to hold a substrate;

a projection system configured to project the patterned radiation beam onto a target portion of the substrate, the projection system comprising a projection system housing supporting internally one or more lens elements; and a movement damper connected to at least one of the one or more lens elements, the movement damper configured to damp movement of the at least one of the one or more lens elements at an eigenfrequency of the at least one of the one or more lens elements.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
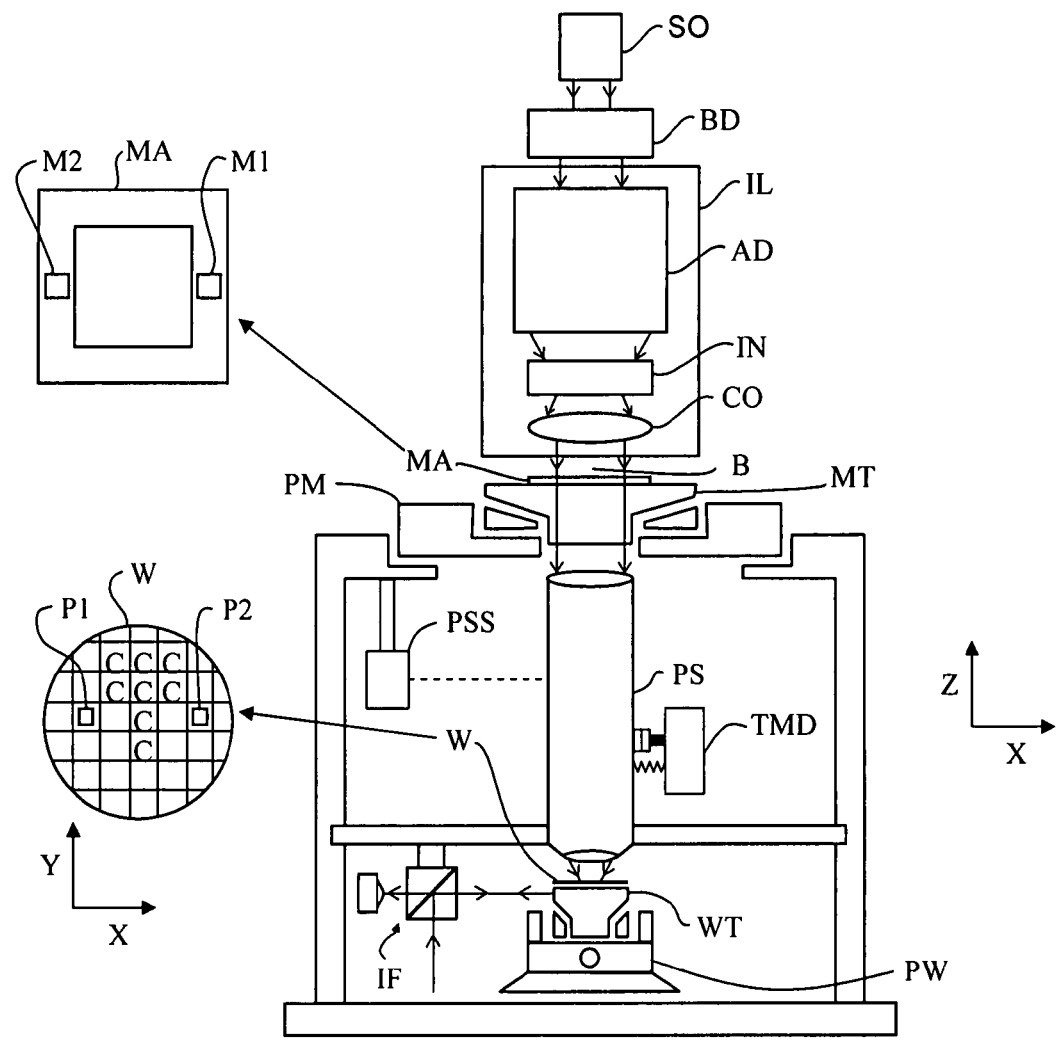
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support (e.g. a mask table) MT constructed to support a patterning device (e.g. a mask) MA and connected to a first positioning device PM configured to accurately position the patterning device in accordance with certain parameters. The apparatus also includes a substrate support (e.g. a substrate table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate supports (and/or two or more patterning device supports). In such "multiple stage" machines the additional supports may be used in parallel, or preparatory steps may be carried out on one or more supports while one or more other supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate support WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support MT may be realized with the aid of a long-stroke module (coarse positioning) and a short-stroke module (fine positioning), which form part of the first positioning device PM. Similarly, movement of the substrate support WT may be realized using a long-stroke module and a short-stroke module, which form part of the second positioner PW. In the case of a stepper (as opposed to a scanner) the patterning device support MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support MT and the substrate support WT are kept essentially stationary, while an entire pattern imparted to the radiation beam is projected onto a target portion C at one time (i.e. a single static exposure). The substrate support WT is then shifted in the X and/or Y direction so that a different target portion C can be exposed. In step mode, the maximum size of the exposure field limits the size of the target portion C imaged in a single static exposure.

2. In scan mode, the patterning device support MT and the substrate support WT are scanned synchronously while a pattern imparted to the radiation beam is projected onto a target portion C (i.e. a single dynamic exposure). The velocity and direction of the substrate support WT relative to the patterning device support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support MT is kept essentially stationary holding a programmable patterning device, and the substrate support WT is moved or scanned while a pattern imparted to the radiation beam is projected onto a target portion C. In this mode, generally a pulsed radiation source is employed and the programmable patterning device is updated as required after each movement of the substrate support WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Again referring to FIG. 1, a position sensor PSS is shown which is configured to measure a position signal, such as position, speed or acceleration, of the projection system PS. This signal is fed into the servo control loop of the substrate support WT and/or the patterning device support MT in order to take any movements of the projection system into account during positioning of the respective support. For this reason, the position sensor PSS is arranged on a frame and measures position, speed or acceleration or any other position signal of the projection system housing. A possible embodiment of a servo system taking into account the movements of the projection system, in particular the projection system housing is disclosed in U.S. Pat. No. 6,420,716.

As will explained hereinafter in more detail, the projection system housing may, due to external forces such as forces caused by mechanical vibration, acoustics, gas flow, etc., be excited at an eigenfrequency of one or more lens elements arranged in the projection system housing. The resulting movement of the projection system housing will be taken into account in the servo control loop of the substrate and/or patterning device support, which attempts to position the support with respect to the projection system housing. However, the frequency with which the projection system housing vibrates may be too high for the support to follow, hence inducing imaging errors because the relative position of the support and the projection system housing is not according to the desired position. Alternatively, an increased settling time of the servo system could be used to wait until the projection system housing stops vibrating, which settling time would have to be large since these lens elements are mounted in the projection system housing with a mounting having a low damping. As a result the overall throughput of the lithographic may be negatively influenced.

To decrease the influence of an external force on the settling time of the servo control system of the substrate or patterning device support, a tuned mass damper TMD is provided in the lithographic apparatus of FIG. 1. The tuned mass damper TMD is arranged externally of the projection system and connected to the projection system housing. The tuned mass damper TMD is configured to damp movement of the projection system housing at one or more typical eigenfrequencies of the projection system. As a result, the movement of the projection system at these one or more eigenfequencies, for instance, of a lens element of the projection system is damped and as a result the settling time of the servo control system may be decreased.

The tuned mass damper shown in FIG. 1 is tuned at the mass of the projection system housing and the eigenfrequency of the lens elements. Such an eigenfrequency is typically about 300 Hz or in the range of 400 to 600 Hz, in particular about 450 Hz. In view of the relative large mass of the projection system, the mass required for the tuned mass damper is also considerable. Therefore, it is desirable that the mass is an already existing part of the lithographic apparatus. In an embodiment, the tuned mass damper, or at least a part thereof, is formed by a lens cooling device. Such a lens cooling device has, in an embodiment, a mass substantially equal to the mass required for the tuned mass damper. To make the lens cooling device function as a tuned mass damper, the lens cooling device is connected with an appropriate spring and damper to the housing of the projection system. Any other mass suitable to serve as a tuned mass damper may also be applied.

Figure 2:
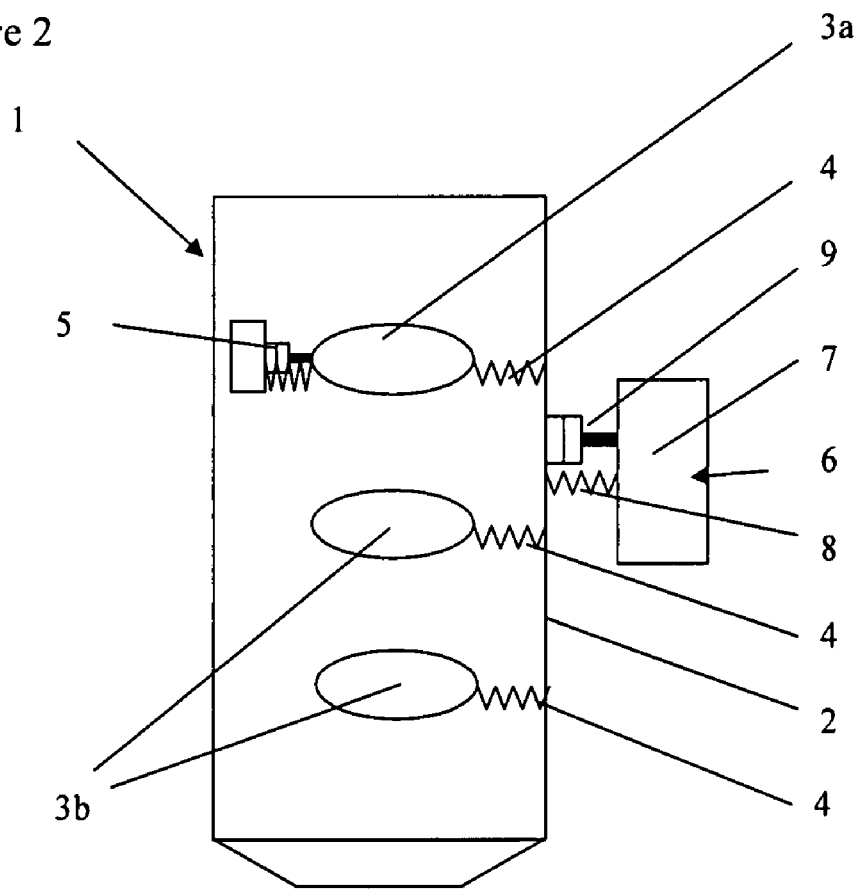
FIG. 2 depicts a cross section of a projection system according to an embodiment of the invention.

FIG. 2 shows a cross section of a projection system 1 according to an embodiment of the invention. The projection system 1 comprises a housing 2. In the housing 2 a number of lens elements 3a, 3b are arranged. The lens elements 3a, 3b are mounted in the housing 2 using mounting elements 4 having a low damping because of the usage of low damping materials like steel, and the desired mechanically stable construction.

Due to the low damping between housing 2 and the lens elements 3a, 3b, forces exerted on the projection system housing 2 may result in vibrations of the lens elements at their eigenfrequency. For some lens elements these oscillating movements at the eigenfrequency may have a negative influence on the imaging accuracy. Assuming that the oscillating movement of the lens element 3a has such negative influence on the imaging accuracy, it is proposed to connect a tuned mass damper 5 to this lens element 3a. This tuned mass damper 5 is arranged internally of the housing 2. Tuned mass damper 5 is configured to damp the oscillating movements of the lens element 3a at the eigenfrequency of that lens element, in order to avoid a decrease in imaging accuracy. Also, other damping principles are possible to damp lens element 3a, such as an eddy-current damper, etc.

Oscillating movement of the lens elements 3b does not have a considerable influence on the imaging accuracy of the projection system. Therefore, no tuned mass damper is provided for lens elements 3b. However, the oscillating movements of the lens elements 3b may excite the housing 2 to move with substantially the same frequency as the lens elements 3b, thus possibly increasing imaging errors and/or settling time of the servo control system of the substrate support and/or patterning device support. To avoid or reduce this movement, the lens elements 3b may also be provided with a tuned mass damper 5. However, as the projection system of a lithographic apparatus comprises a considerable number of lens elements, it may be expensive or impractical to provide a tuned mass damper for each lens element. Furthermore, the volume of the projection system may have to increase substantially to house a tuned mass damper for each lens element of the projection system, which increase in volume is generally undesirable.

So, according to an embodiment, a tuned mass damper 6 may be arranged outside of the housing 2. The tuned mass damper 6 is connected to the housing 2 to damp movement of the housing 2 at the eigenfrequency of the lens elements 3a, 3b. The tuned mass damper 6 comprises a mass 7 which is connected via a spring 8 and a damper 9 to the housing 2. The mass 7, spring 8 and damper 9 are chosen such that movement of the housing 2 at the selected frequency is substantially damped. As a result, the position of the housing 2 is more stable and the servo system of the substrate support and/or patterning device may more easily follow the housing position, thus possibly reducing imaging errors and/or realizing a higher throughput in the lithographic apparatus.

In an embodiment, only one tuned mass damper 6 is used to damp the movement of the housing 2 instead of providing a tuned mass damper 5 for each lens element 3. Moreover, the tuned mass damper 6 is arranged outside the projection system, and therefore the tuned mass damper does not require an increase of volume of the projection system. In an embodiment, an existing part of the lithographic apparatus may be used as a mass 7 for the tuned mass damper 6, such as a lens cooling device. Use of an existing part avoids the need to introduce a separate mass in the lithographic apparatus, which would normally be the case when a tuned mass damper is arranged inside the housing 2.

It is possible that the housing 2 is not completely rigid. As a result, the housing 2 may undergo elastic deformations as a result of an external force exerted on the housing 2. Such movement of the housing 2 may also be damped by the tuned mass damper 6. Such damping of movement also has a positive influence on imaging accuracy and/or servo settling time. In such an embodiment, the tuned mass damper will be tuned at an eigenfrequency of the housing 2 itself.

The effect of a tuned mass damper for the projection system housing will now be explained using a simulation example as follows.

Figure 3:
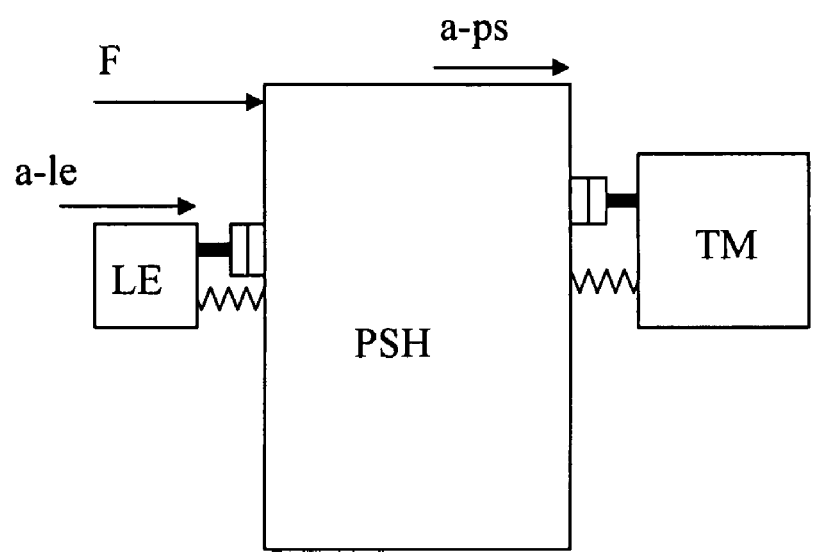
FIG. 3 depicts schematically a mass spring system of a projection system according to an embodiment of the invention for use in a simulation.

FIG. 3 shows a schematic overview of a mass-spring system which is used for simulation of the effect of a tuned mass damper according to an embodiment of the invention. FIG. 3 shows schematically a projection system housing PSH supporting a lens element LE. Further, the projection system housing PSH is connected to a tuned mass TM in order to damp movement of the projection system housing at the eigenfrequency of the lens element 3. The movement of the lens element LE and projection system housing PSH is caused by an external force F exerted on the projection system housing.

The projection system housing has been given a mass of 950 kg, the lens element a mass of 50 kg and the tuned damper a mass of 100 kg.

Figure 4:
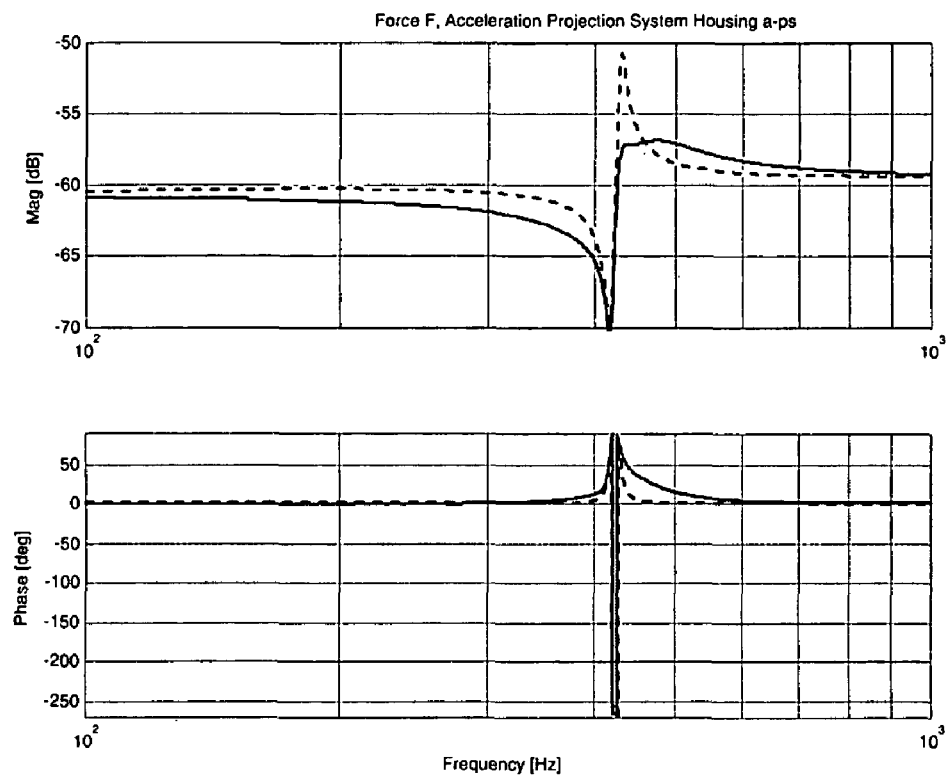
FIG. 4 depicts a Bode plot of responses of the projection system housing to an external force applied on the projection system housing.
Figure 5:
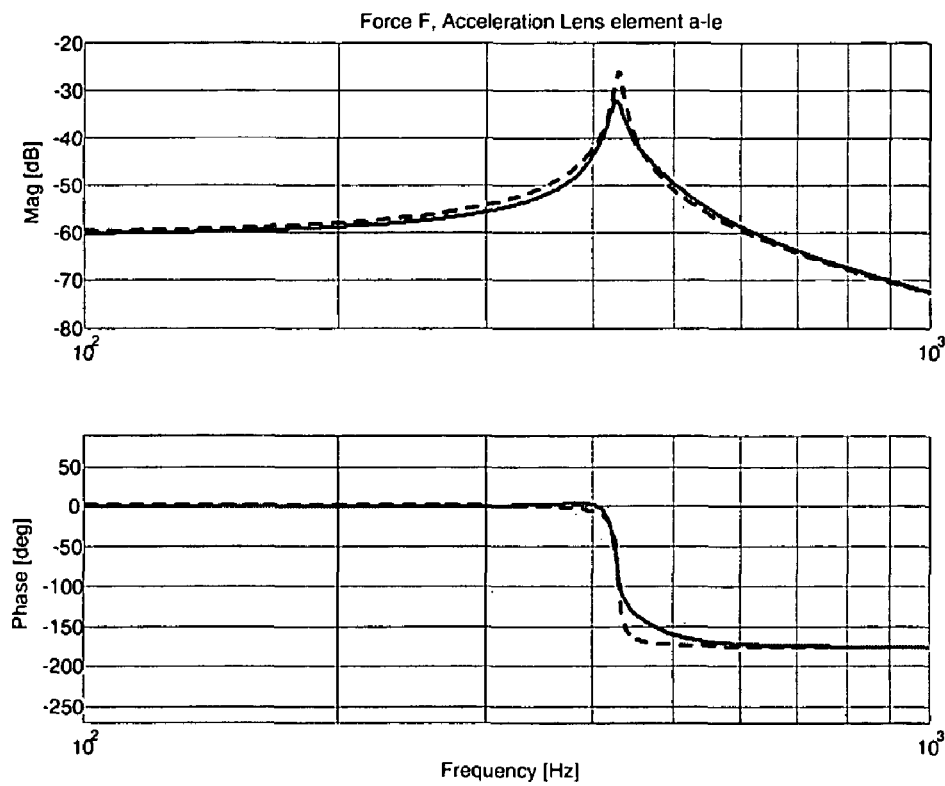
FIG. 5 depicts a Bode plot of responses of a lens element to an external force applied on the projection system housing.

FIGS. 4 and 5 show Bode plots of the projection system housing acceleration a-ps and the lens element acceleration a-le, respectively, in response to a force F exerted on the projection system housing. The dashed lines show Bode plots in a simulation in which the tuned mass damper was not present. The solid lines show the Bode plots wherein the tuned mass damper was provided to damp movement of the projection system housing.

In FIG. 4 it can be seen that the acceleration of the projection system housing a-ps in response to a force exerted on the projection system housing is substantially damped when a tuned mass damper is present. Thus, when a disturbing force is exerted on the projection system housing, the movement of the projection system housing at the eigenfrequency of the lens elements is damped.

In FIG. 5 the Bode plot of the acceleration of the lens element a-le in response to a force F exerted on the projection system housing PSH is shown. The Bode plot shows that the effect of the presence of the tuned mass damper connected to the housing is considerably smaller for the movement of the lens element LE. However, for a lens element whose movement has a considerable influence on imaging accuracy, a separate tuned mass damper may be provided to damping movement of the lens element itself. In such an embodiment, the damping is not substantially influenced by the presence of the tuned mass damper on the housing.

The use of a tuned mass damper to damp movement of the housing of the projection system at the eigenfrequency of one or more lens elements was discussed. According to an embodiment of the invention, it may be possible to provide additionally or alternatively a movement damper which is designed to damp movement of the projection system housing at the eigenfrequency of one or more lens elements supported by the housing.

Furthermore, the effect of the tuned mass damper has been explained with reference to one degree of freedom. The same effect may obtained for one or more other degrees of freedom by providing a movement damper capable of damping movement in more than one degree of freedom and/or by providing different movement dampers for different degrees of freedom.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a patterning device support configured to hold a patterning device, the patterning device capable of imparting a radiation beam with a pattern in its cross-section to form a patterned radiation beam;
    a substrate support constructed to hold a substrate;
    a projection system configured to project the patterned radiation beam onto a target portion of the substrate, the projection system comprising a projection system housing supporting internally a plurality of lens elements using mounting elements coupling the plurality of lens elements to the projection system housing; and
    a movement damper connected to, and arranged externally of, the projection system housing, the movement damper configured to damp movement of the projection system housing at an eigenfrequency of at least one of said plurality of lens elements that are arranged internally of the projection system housing,
    wherein the movement damper is a tuned mass damper, tuned on the eigenfrequency of the at least one of said plurality of lens elements.

2. The lithographic apparatus of claim 1, wherein the eigenfrequency is in the range of 400 to 600 Hz.

3. The lithographic apparatus of claim 2, wherein the eigenfrequency is about 450 Hz.

4. The lithographic apparatus of claim 1, wherein the movement damper is tuned to a mass of the projection system housing.

5. The lithographic apparatus of claim 1, comprising another movement damper arranged internally of the projection system housing and connected to one of said plurality of lens elements.

6. The lithographic apparatus of claim 5, wherein the other movement damper is configured to damp movement of said one of said plurality of lens elements at an eigenfrequency of said one of said plurality of lens elements.

7. The lithographic apparatus of claim 1, comprising a lens cooling device, wherein the tuned mass damper includes a mass, a spring and a damper and wherein at least part of the mass of the tuned mass damper is provided by the lens cooling device.

8. A lithographic apparatus comprising:
    a patterning device support configured to hold a patterning device, the patterning device capable of imparting a radiation beam with a pattern in its cross-section to form a patterned radiation beam;
    a substrate support constructed to hold a substrate;
    a projection system configured to project the patterned radiation beam onto a target portion of the substrate, the projection system comprising a projection system housing supporting internally a plurality of lens elements using mounting elements coupling the plurality of lens elements to the projection system housing; and
    a movement damper connected to, and arranged externally of, the projection system housing, the movement damper configured to damp movement of the projection system housing at an eigenfrequency of at least one of the said plurality of lens elements that are arranged internally of the projection system housing,
    wherein the movement damper is a tuned mass damper, tuned on the eigenfrequency of the at least one of said plurality of lens elements, and
    wherein the tuned mass damper comprises a mass, a spring and a damper and wherein at least part of the mass of the tuned mass damper is provided by at least part of a lens cooling device.

9. The lithographic apparatus of claim 1, wherein the projection system comprises one or more tuned mass dampers, each tuned mass damper connected to one of the one or more lens elements.

10. The lithographic apparatus of claim 1, further comprising a servo control system configured to position a movable object, the servo control system comprising an addition device to add a position signal of the projection system housing in a control loop of the servo control system.

11. The lithographic apparatus of claim 10, wherein the movable object is the patterning device support or the substrate support.

12. A method for improving servo performance of a movable stage in a lithographic apparatus, the lithographic apparatus comprising a projection system housing supporting internally a plurality of lens elements using mounting elements coupling the plurality of lens elements to the projection system housing and a controller of the movable stage using a position signal of the projection system housing, the method comprising damping movement of the projection system housing at an eigenfrequency of at least one of said plurality of lens elements using a movement damper connected to, and arranged externally of, the projection system housing, wherein the movement damper is a tuned mass damper, tuned on the eigenfrequency of the at least one of said plurality of lens elements that are arranged internally of the projection system housing.

13. The method of claim 12, wherein the eigenfrequency is in the range of 400 to 600 Hz.

14. The method of claim 13, wherein the eigenfrequency is about 450 Hz.

15. The method of claim 12, wherein the lithographic apparatus comprises a lens cooling device, wherein the tuned mass damper includes a mass, a spring and a damper and wherein at least part of the mass of the tuned mass damper is provided by the lens cooling device.

16. A device manufacturing method, comprising:
projecting a patterned beam of radiation onto a target portion of a substrate using a plurality of lens elements supported internally by a projection system housing using mounting elements coupling the plurality of lens elements to the projection system housing; and
damping movement of the projection system housing at an eigenfrequency of at least one of said plurality of lens elements using a movement damper connected to, and arranged externally of, the projection system housing,
wherein the movement damper is a tuned mass damper, tuned on the eigenfrequency of the at least one of said plurality of lens elements that are arranged internally of the projection system housing.

17. The method of claim 16, comprising damping the movement using a tuned mass damper tuned on an eigenfrequency in the range of 400 to 600 Hz.

18. The method of claim 16, further comprising positioning a patterning device used to pattern the patterned radiation beam, or the substrate, or both the patterning device and the substrate, using a servo control system and adding a position signal of the projection system housing in a control loop of the servo control system.

19. The method of claim 16, wherein the tuned mass damper includes a mass, a spring and a damper and wherein at least part of the mass of the tuned mass damper is provided by a lens cooling device.

* * * * *